US005654970A

United States Patent [19]
DaCosta et al.

[11] Patent Number: 5,654,970
[45] Date of Patent: Aug. 5, 1997

[54] ARRAY WITH REDUNDANT INTEGRATED SELF-TESTING SCAN DRIVERS

[75] Inventors: Victor M. DaCosta, Santa Cruz; Duane Siemens, Redwood City, both of Calif.

[73] Assignee: Xerox Corporation, Stamford, Conn.

[21] Appl. No.: 575,784

[22] Filed: Dec. 22, 1995

[51] Int. Cl.$^6$ .................................................. G01R 31/28
[52] U.S. Cl. ...................... 371/22.31; 395/183.01
[58] Field of Search .............................. 371/22.3; 395/183

[56] References Cited

U.S. PATENT DOCUMENTS 5,581,541  12/1996  Whetsel ................................. 371/22.3

Primary Examiner—Vincent P. Canney

[57] ABSTRACT

An array includes redundant integrated scan drivers that can provide signals to each other through scan lines. Each scan driver can be a shift register, each stage of which includes a tri-state inverter to provide its output to one of the scan lines. To transfer signals from one shift register to the other, one shift register provides signals while the outputs of the other shift register are in a floating state. The other shift register receives the signals and can then shift them to its output. The signals can be test signals used to detect defects in the shift registers and in the array. Also, each stage in each shift register is connected to receive signals from the scan line that is driven by the preceding stage. Therefore, if the preceding stage is removed due to a defect, the following stage can receive signals through the scan line from the other shift register and continue to function even though its preceding stage is removed.

13 Claims, 6 Drawing Sheets

ARRAY WITH REDUNDANT INTEGRATED SELF-TESTING SCAN DRIVERS

BACKGROUND

The present invention relates to circuitry for driving arrays.

Matsueda, Y., Ashizawa, M., Aruga, S., Ohshima, H., Morozumi, S., "Defect-Free Active-Matrix LCD with Redundant Poly-Si TFT Circuit," *SID 89 Digest*, 1989, pp. 238-241, describe inspection and repair of a redundant thin film transistor liquid crystal display (TFT-LCD) circuit. As shown and described in relation to FIG. 1, peripheral drivers can be integrated on both sides of the scanning lines and data lines. Short inspection techniques are described in relation to FIGS. 3-7. As described in relation to FIG. 7, if a peripheral driver does not operate correctly, the display is considered defective because further inspection is not possible.

Misawa et al., EP-A 342 925, describe an active matrix panel with a picture element matrix mounted on a substrate, including gate lines, source lines, a gate line drive circuit, and a source line drive circuit. As shown and described in relation to FIGS. 1-2(e), the gate line drive circuit can be a silicon thin film complementary metal oxide semi-conductor (CMOS) structure with a shift register. The shift register can be a static or dynamic circuit of complementary (P type and N type) or monoconductive TFTs. FIGS. 2(a)-2(e) show shift register circuits, with inverters, some of which are clocked with a clock signal and others with an inverted clock signal. As shown and described in relation to FIGS. 8-10(b), a gate line drive circuit can be formed at the left and/or the right periphery of the active matrix panel, with complementary TFT inverters. As shown and described in relation to FIG. 4, a shift register forming part of a gate line drive circuit can be connected to a gate line test circuit with a test signal input terminal and a test signal output terminal, with a test circuit on each gate line; the shift register is scanned while a test signal is input, and the serial output of the test signal output terminal indicates whether the circuit is good.

SUMMARY OF THE INVENTION

The invention addresses a basic problem in integrating an array, such as an active matrix display array, on the same substrate with its drive circuitry.

When drive circuitry is integrated on the same substrate with an array, test of the drive circuitry and the array becomes more complicated than if the drive circuitry is on one or more separate substrates.

The invention is based on the discovery of a technique that alleviates the testing problem for integrated scan drivers. The technique improves redundant scan drivers as in the article by Matsueda et al., described above, by allowing one scan driver to receive signals from the other. In effect, the scan drivers can be operated bidirectionally, with one scan driver operating in a serial in/parallel out mode while the other operates in a parallel in/serial out mode. The ability for a scan driver to both provide signals to and receive signals from a scan line makes testing possible, because one scan driver can provide test signals through the scan line to the other, and the test signals can then be analyzed to detect defects. In addition, the ability for a stage of one scan driver to receive signals from a preceding stage of another scan driver can be useful after a repair eliminates a stage of a scan driver.

The technique can be implemented as an improvement in an array that includes scan lines that extend across the surface of a substrate. The array also includes first and second scan drive circuitry in the first and second scan drive regions, respectively. For each of a set of the scan lines, the first and second scan drive circuitry include first and second signal providing circuitry, respectively, electrically connected for providing signals to the scan line. The improvement includes, for at least one scan line, first signal receiving circuitry electrically connected to the scan line for receiving signals from the scan line that are provided to the scan line by the second signal providing circuitry. As a result, the first scan drive circuitry can receive signals provided to the scan lines by the second scan drive circuitry. In other words, the improvement makes the first scan drive circuitry bidirectional.

The second scan drive circuitry can also include signal receiving circuitry, making both scan drivers bidirectional. The first and second scan drive circuitry can be on opposite sides of the array so that signals can be provided and received in both directions across the array.

The scan drive circuitry can include two shift registers, each with a stage for each scan line. Each scan line's stage of each shift register can provide signals to the scan line, and the next stage can receive signals from the scan line, so that each stage of one shift register provides signals through its scan line to the next stage of the other shift register.

The signal providing circuitry can have, in addition to its signal providing states, a signal receiving state. The signal providing circuitry can include a tri-state element electrically connected to its scan line. The tri-state element can be tri-stated, i.e. in its floating state, when the signal providing circuitry is in its signal receiving state.

The array can include leads for receiving signals from or providing signals to circuitry off the substrate. In addition to an input lead and an output lead for each shift register, for example, each shift register can have an input/output lead after every Mth stage, so that the shift register is divided into N groups of M stages, for a total of N×M=P stages. The additional input/output leads make it possible to test each group of stages independently of other groups.

The technique can provide an array with redundant scan line shift registers that can be used to provide and receive signals. The technique could be applied, for example, in a light valve array for an AMLCD.

The technique described above is advantageous because it can provide an array in which redundant scan line shift registers have enhanced functionality. One shift register can be used to sample output from the other shift register and vice versa, making it possible to detect scan line shorts and opens and date line to scan line shorts. In addition, the shift registers can be used to test each other for defective stages. If a repair is made that eliminates a defective stage of one shift register, the following stage can receive its input signal through the scan line from the other shift register.

The following description, the drawings, and the claims further set forth these and other aspects, objects, features, and advantages of the invention.

DETAILED DESCRIPTION

A. Conceptual Framework

Figure 1:
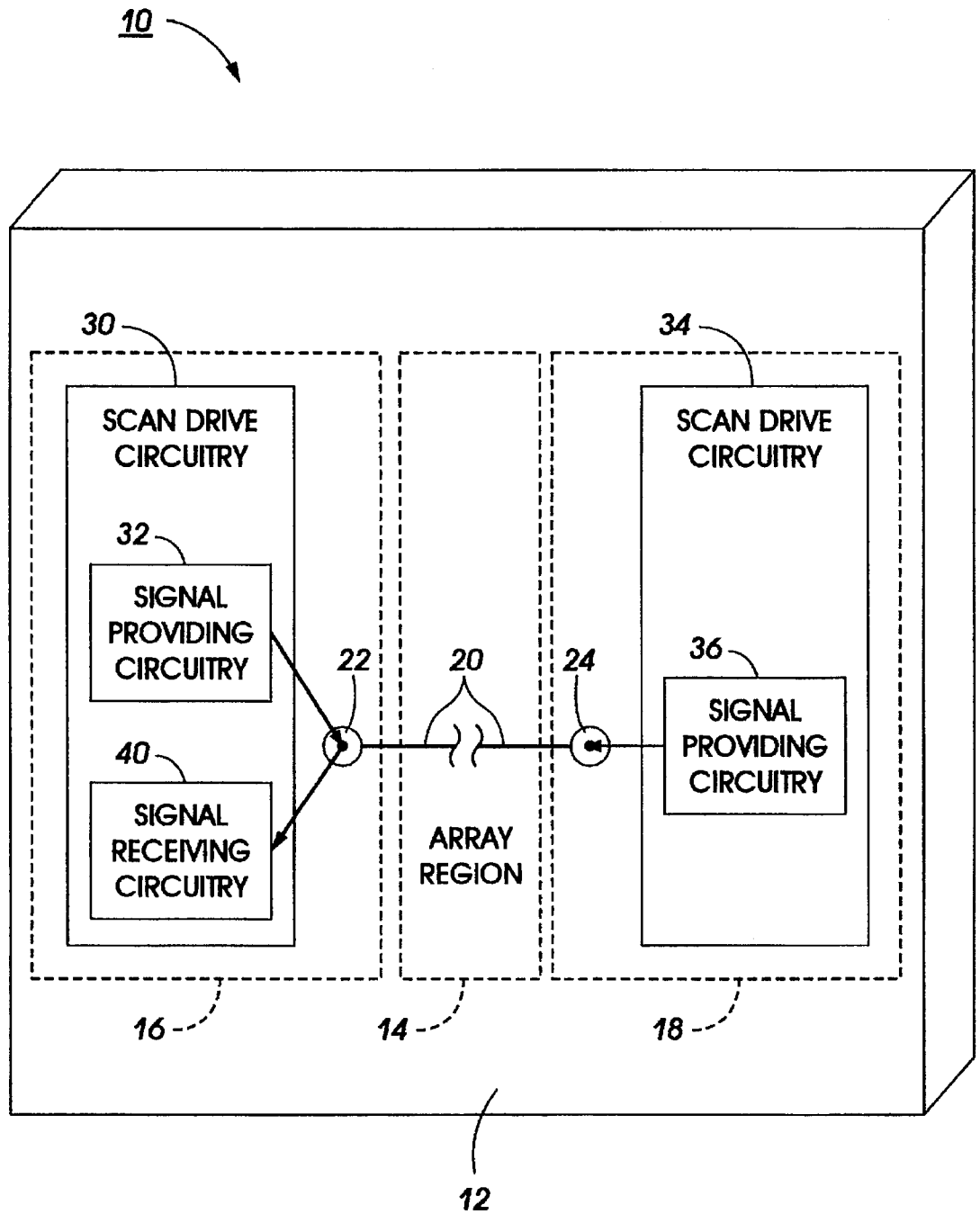
FIG. 1 is a schematic circuit diagram showing an array with scan drive circuitry for concurrently providing signals to scan lines from each end and with signal receiving circuitry at one end of a scan line receiving signals from signal providing circuitry at the other.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "stores" a first signal when it receives the first signal at one time and, in response, provides the second signal at another time. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

A "thin-film structure" is an electric structure that is formed at a surface of an insulating substrate. A thin-film structure could be formed, for example, by deposition and patterned etching of films on the insulating substrate's surface.

An "integrated circuit" is a circuit formed at a substrate's surface by batch processes such as deposition, lithography, etching, oxidation, diffusion, implantation, annealing, and so forth.

A "layer" is a thickness of material formed over a surface and extending generally parallel to the surface, with one side toward the surface and another side away from the surface.

A "lead" is a part of a component at which the component is electrically connected to other components. A "line" is a simple component that extends between and electrically connects two or more leads. A line is "connected between" the components or leads it electrically connects. A "conductive line" is a line that is conductive between the leads it connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

An "error" or "defect" in an electric structure is a part of the structure that does not function properly due to random or uncontrolled events that occur during production of the structure. Examples of errors and defects include open lines and shorts between lines. An act "repairs" an error or defect in a structure by modifying the structure so that circuitry in the structure functions properly.

A "repair line" is a line in an electric structure that can be used in repairing the electric structure.

An operation or event "transfers" an item of data from a first component to a second if the result of the operation or event is that an item of data in the second component is the same as an item of data that was in the first component prior to the operation or event. The first component "provides" the data, and the second component "receives" or "obtains" the data.

A "shift register" is a component of circuitry that has a series of parts, referred to herein as "stages," each capable of storing an item of data, with the stages of the shift register being connected so that the item of data stored in a stage is transferred to the next stage in the series for storage in response to a signal or set of signals, sometimes referred to as a "clock signals."

The term "tri-state," when applied to an element of circuitry such as an inverter or buffer, means that the element's output has three states, two low impedance states referred to herein as an ON or 1 state an OFF or 0 state, and a high impedance state referred to as a floating or Z state. The verb "to tri-state" means to provide signals that place a tri-state element's output in its high impedance state.

B. General Features

FIG. 1 shows general features of the invention. FIG. 1 shows an array with redundant scan drive circuitry in which signal providing circuitry at one end of a scan line can provide signals through a scan line to signal receiving circuitry at the other.

Array 10 in FIG. 1 includes substrate 12 on a surface of which array circuitry is formed. The surface includes array region 14 and, at opposite sides of array region 14, scan drive regions 16 and 18. Scan lines extend across array region 14 between scan drive regions 16 and 18, with scan line 20 and connected circuitry being shown in more detail.

Scan line 20 is electrically connected to scan lead 22 in scan drive region 16 and to scan lead 24 in scan drive region 18. Scan drive circuitry 30 in scan drive region 16 includes signal providing circuitry 32, and scan drive circuitry 34 in scan drive region 18 includes signal providing circuitry 36.

Signal providing circuitry 32 and 36 are connected to scan leads 22 and 24, respectively, so that they can concurrently provide signals to scan line 20.

Scan drive circuitry 30 also includes signal receiving circuitry 40, which is electrically connected to receive signals from scan line 20. As a result, signal receiving circuitry 40 can receive signals from scan line 20 that are provided by signal providing circuitry 36.

C. Implementation

The general features described above could be implemented in numerous ways. An implementation described below provides an array suitable for a liquid crystal display (LCD), with scan driver circuitry that includes poly-Si TFTs.

C.1. Redundant Scan Drive Circuitry

Figure 2:
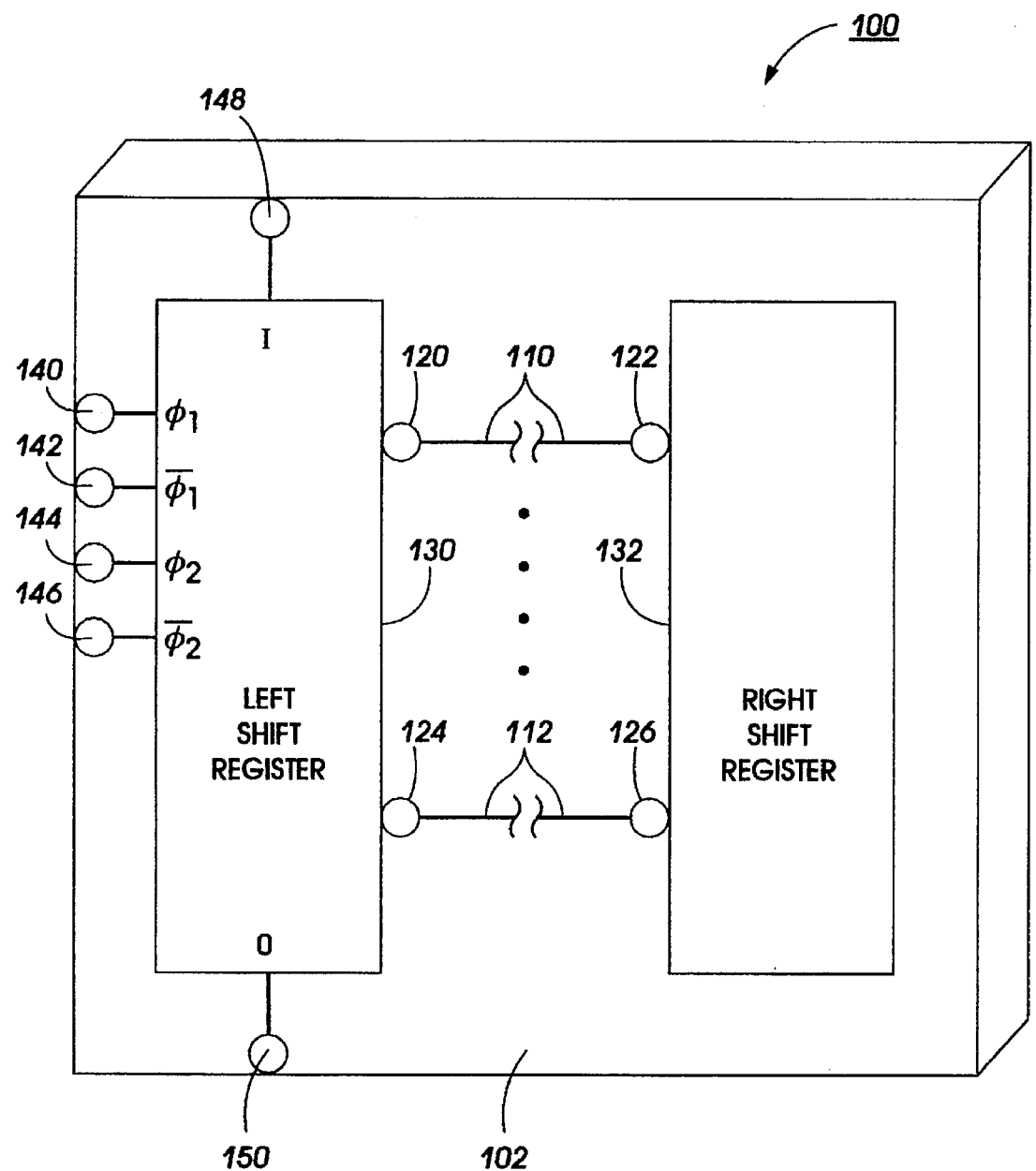
FIG. 2 is a schematic circuit diagram showing an array with redundant shift registers for driving scan lines. ·
Figure 3:
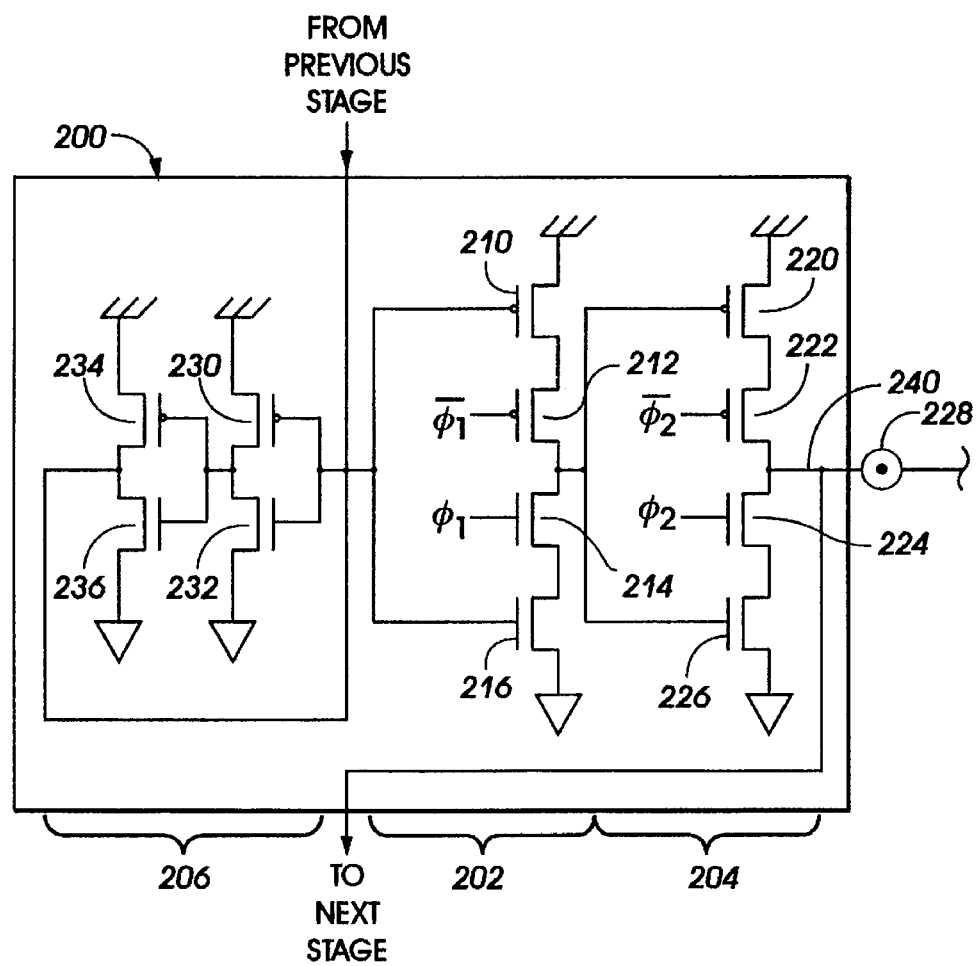
FIG. 3 is a schematic circuit diagram showing circuitry in a stage of either of the shift registers in FIG. 2.
Figure 4:
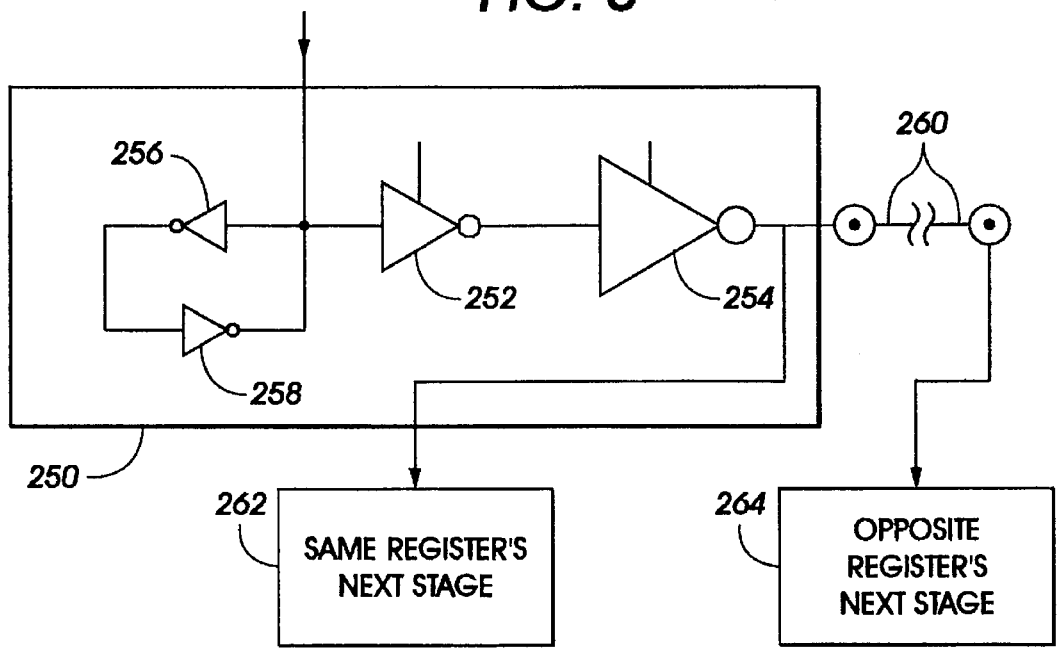
FIG. 4 is a schematic circuit diagram showing higher level equivalents of circuitry in FIG. 3.

FIGS. 2–4 show features of redundant scan drive circuitry for an LCD array. FIG. 2 shows an array with redundant shift registers for driving scan lines. FIG. 3 shows circuitry in a stage of either of the shift registers in FIG. 2. FIG. 4 shows higher level equivalents of circuitry in FIG. 3.

Array 100 in FIG. 2 includes substrate 102 across a surface of which scan lines 110 through 112 extend. Each of scan lines 110 through 112 has two leads, as illustrated by leads 120, 122, 124, and 126, one lead for connecting to left shift register 130 and the other lead for connecting to right shift register 132. Scan lines 110 through 112 can therefore be driven from both ends by left shift register 130 and right shift register 132, assuming neither shift register is defective.

Each of shift registers 130 and 132 can receive five signals from circuitry off of substrate 102 and can provide one signal to circuitry off of substrate 102, as illustrated by leads 140, 142, 144, 146, 148, and 150 for left shift register 130. Through leads 140 and 142, a shift register receives a first clock signal $\Phi_1$ and its complement, respectively. Through leads 144 and 146, a shift register receives a second clock signal $\Phi_2$ and its complement, respectively. Through lead 148, a shift register receives an input signal, I. Finally, through lead 150, a shift register provides an output signal, O.

Although FIG. 2 shows shift registers receiving not only each clock signal but also the complements of the clock signals from external circuitry, only one input lead would be necessary for each clock signal if additional circuitry on substrate 102 could provide each clock signal's complement in response to the clock signal.

FIG. 3 shows stage 200, which could be a stage in either of shift registers 130 and 132. As can be understood, each of shift registers 130 and 132 includes one such stage for each of scan lines 110 through 112, with each stage's output being the input of the next succeeding stage as shown in FIG. 3.

Stage 200 includes three groups of transistors. Group 202 operates as a first tri-state inverter; group 204 as a second tri-state inverter; and group 206 as a bus repeater.

Group 202 includes two normally ON PMOS transistors 210 and 212 and two normally OFF NMOS transistors 214 and 216. The gate leads of transistors 210 and 216 receive the input signal of stage 200, received from the next preceding stage, or, if stage 200 is the first stage of a shift register, from a lead through which the shift register receives input signals from circuitry off of the substrate. The gate leads of transistors 214 and 212 receive clock $\Phi_1$ and its complement, respectively.

Similarly, group 204 includes two normally ON PMOS transistors 220 and 222 and two normally OFF NMOS transistors 224 and 226. The gate leads of transistors 220 and 226 receive the output from group 202, taken between the channels of transistors 212 and 214. The gate leads of transistors 224 and 222 receive clock $\Phi_2$ and its complement, respectively. The output of group 204, taken between the channels of transistors 222 and 224, is connected to a scan line through lead 228 and is also provided to the next stage in the shift register or, if stage 200 is the last stage, to a lead through which the output from the shift register can be provided to circuitry off of the substrate.

Group 206 includes two back-to-back inverters, the first including normally ON PMOS transistor 230 and normally OFF NMOS transistor 232 and the second including normally ON PMOS transistor 234 and normally OFF NMOS transistor 236. Like transistors 210 and 216, the gate leads of transistors 230 and 232 receive the input signal of stage 200. The gate leads of transistors 234 and 236 receive the output from the first inverter, taken between the channels of transistors 230 and 232. The output from the second inverter, taken between the channels of transistors 234 and 236, is connected to the input of stage 200.

FIG. 3 also shows the location of repair line 240, a line electrically connecting the output of group 204 between the channels of transistors 222 and 224 to lead 228 and to the next stage of the shift register. As can be seen from FIG. 3, if repair line 240 is cut, the scan line connected to lead 228 is still electrically connected to the next stage of the shift register.

The operation of the circuitry in stage 200 can be understood from the higher level representation of stage 250 in FIG. 4. Tri-state inverter 252 represents group 202 in FIG. 3; tri-state inverter 254 represents group 204; and back-to-back inverters 256 and 258 represent group 206. As suggested in FIG. 4, tri-state inverter 254 is larger than tri-state inverter 252, and inverters 256 and 258 are smaller still.

Tri-state inverter 254 is large because it must be able to act as a buffer, providing sufficient current to concurrently drive scan line 260 and the next stages of both shift registers, with next stage 262 of the same register driven through a direct connection and next stage 264 of the opposite register driven through scan line 260 if the equivalent stage of the opposite shift register is inoperative. In addition, because tri-state inverter 254 has three output states-1, 0, and Z—tri-state inverter 254 can be placed in its high impedance Z state to permit next stage 262 to receive signals from the opposite shift register during testing.

Tri-state inverter 252 acts as an input stage to tri-state inverter 254, and therefore needs to provide only the small current necessary to drive tri-state inverter 254. In addition, if tri-state inverter 252 is small, it requires a smaller input drive current, helping to ensure that tri-state inverter 254 can provide sufficient drive current.

Back-to-back inverters 256 function as a bus repeater, but are very small so that they do not significantly load tri-state inverter 254. Back-to-back inverters 256 hold state temporarily, which can be useful when receiving a signal from a preceding scan line or when scan line 260 has an open near tri-state inverter 254.

Back-to-back inverters 256 and 258 function as a bus repeater, but are very small so that they do not significantly load tri-state inverter 254. Back-to-back inverters 256 and 258 hold the last state the scan line was driven to, which can be useful when scan line 260 has an open near tri-state inverter 254 or when performing certain testing procedures.

When tri-state inverter 254 goes into tri-state after providing a signal, the capacitance of scan line 260 ordinarily provides dynamic storage, slowing decay of the signal sufficiently long for next stage 262 to change state in response to the signal. If scan line 260 has an open near tri-state inverter 254, the capacitance of scan line 260 is no longer available, so that the signal may decay too rapidly for next stage 262 to change state in response. But back-to-back inverters 256 and 258 store the signal from tri-state inverter 254, ensuring that next stage 262 can change state.

Also, some testing procedures require additional operations after a signal is provided on scan line 260 and before clock signal $\Phi_1$ is provided to input tri-state inverter 252 in next stage 262. In this situation, back-to-back inverters 256 and 258 again store the signal on scan line 260 until clock signal $\Phi_1$ is provided.

Stage 200 could be implemented in many ways with a wide variety of layouts and with many different sizes of transistors, but the sizes and other parameters of the transistors are constrained by the array being driven. The cell circuitry of the array determines the capacitance of the scan lines, while the size of the display and its refresh rate determine the scan rate. The capacitance of the scan lines and the scan rate in turn determine the output current required of tri-state inverter 254, since next stage 262 requires very little current compared with scan line 260.

Tri-state inverter 254 must also provide rise times and fall times sufficiently short that a cell's circuitry has sufficient time between the rise time and the fall time to interact with its data line, such as by storing a value from the data line. In other words, tri-state inverter 254 should provide a clean transition to 1 as soon as possible after a data line transition settles and should also provide a clean transition to 0 as late as possible before a data line transition begins. The rise time and the fall time can be made approximately equal by appropriately selecting the transistors for tri-state inverter 254—current provided by PMOS transistors 220 and 222 determines the rise time and current provided by NMOS transistors 224 and 226 determines the fall time. Because a PMOS transistor generally provides about one-third the current of an NMOS transistor of the same size, PMOS transistors 220 and 222 may have roughly three times the width of NMOS transistors 224 and 226.

The output current requirement of tri-state inverter 254 and the required rise and fall times therefore determine the output current required of tri-state inverter 252. As in tri-state inverter 254, PMOS transistors 210 and 212 can be dimensioned to provide approximately the same current as NMOS transistors 214 and 216.

As suggested in FIGS. 3 and 4, clock signals $\Phi_1$ and $\Phi_2$ and their complements are provided as inputs to all stages of both shift registers, and can be used to perform both normal scanning operations and also test operations.

During normal scanning operations, tri-state inverters 252 and 254 function as bi-state inverters. Clock signals $\Phi_1$ and $\Phi_2$ are alternately 1, with clock signal $\Phi_1$ going to 0 before $\Phi_2$ goes to 1, and vice versa. The 1 and 0 periods of each clock signal are sufficiently long for circuitry to stabilize. After clock signal $\Phi_1$ goes to 0 and before clock signal $\Phi_2$ goes to 1, sufficient time must elapse to keep operation of tri-state inverters 252 and 254 separate; the time must, however, be sufficiently short that the signal from tri-state inverter 252 is still stored by the input capacitance of tri-state inverter 256 when $\Phi_2$ goes to 1. In general, the clock signal waveforms depend on various factors including refresh rate of the array and sizes of the TFTs.

When $\Phi_1$ goes to 1, tri-state inverter 252 in each stage receives the stage's input signal, whether from a scan line or the preceding stage, and begins providing its inverse at its output lead. Then, when $\Phi_1$ goes to 0, the inverse of the input signal is stored by the input capacitance of tri-state inverter 254. Then, when $\Phi_2$ goes to 1, tri-state inverter 254 in each stage receives the signal stored by its input capacitance and begins providing its inverse, i.e. the original input signal, at its output lead. Then, when $\Phi_2$ tri-states inverter 254 by going to 0, the original input signal signal as provided at the output of inverter 254 is stored capacitively by scan line 260 and is received by next stages 262 and 264.

Test operations also use the high impedance floating output state of tri-state inverter 254. The floating output can be obtained by holding clock signal $\Phi_2$ at 0, so that transistors 222 and 224 are both OFF and scan line 260 is not driven by tri-state inverter 254 but rather is floating unless driven by the equivalent stage of the opposite shift register. While tri-state inverter 254 is floating, however, tri-state inverter 252 may receive and invert signals from the preceding scan line in response to clock signal $\Phi_1$.

C.2. Test and Repair

Figure 5:
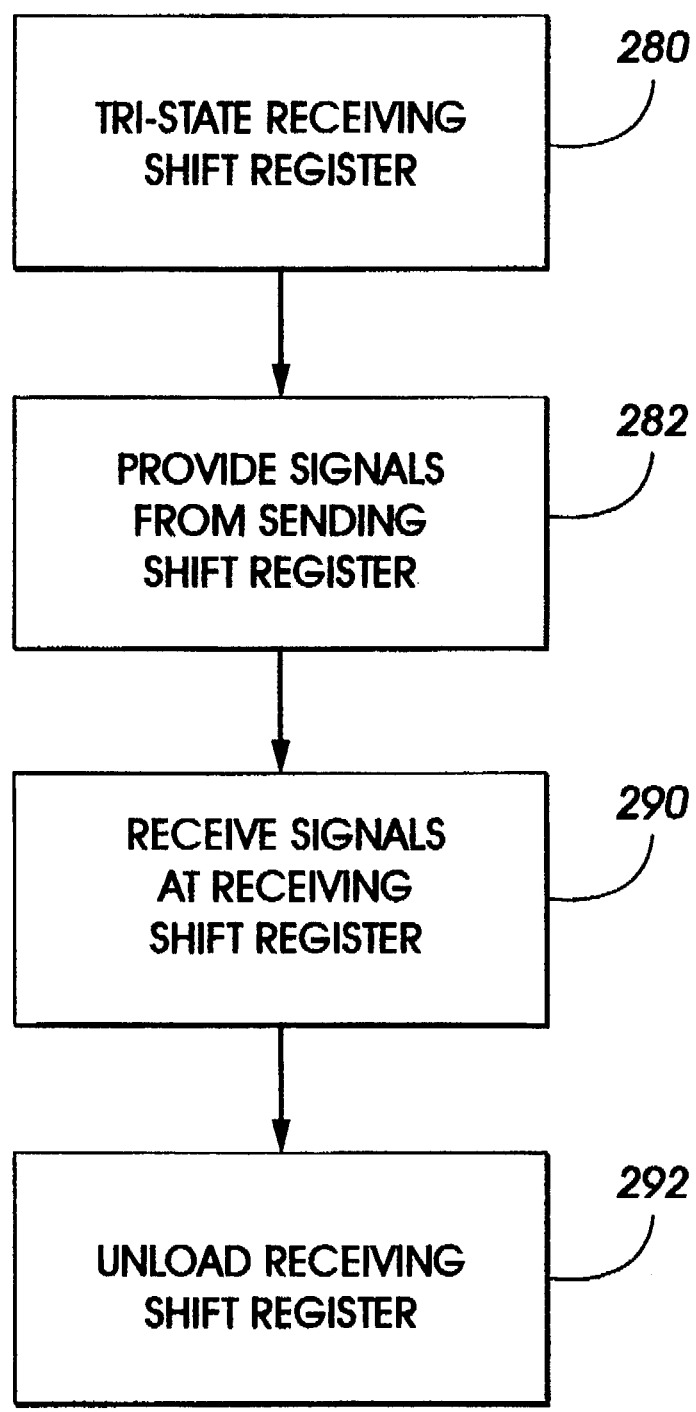
FIG. 5 is a flow chart showing representative acts in testing.
Figure 6:
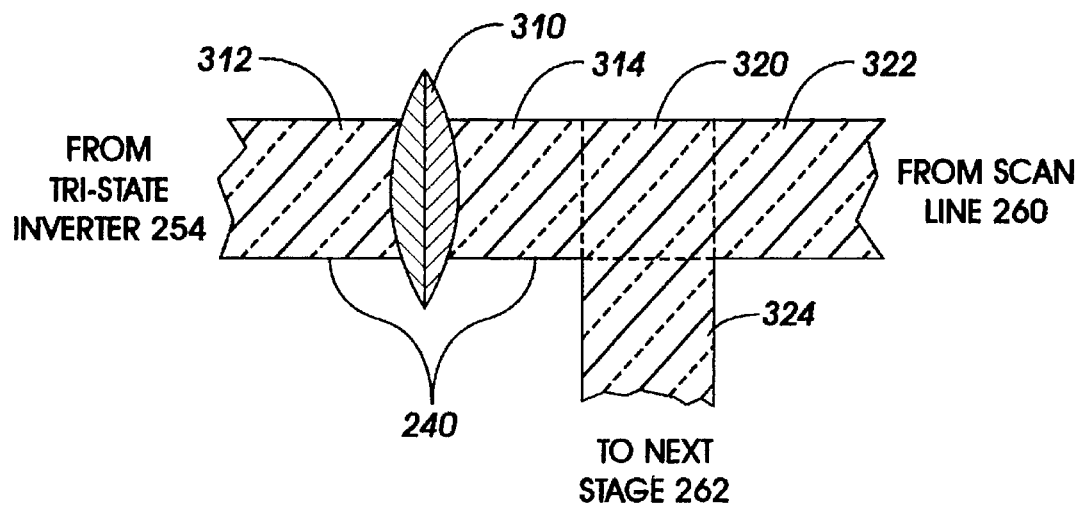
FIG. 6 is a schematic circuit diagram showing how a repair can be performed to eliminate a defective shift register stage.
Figure 7:
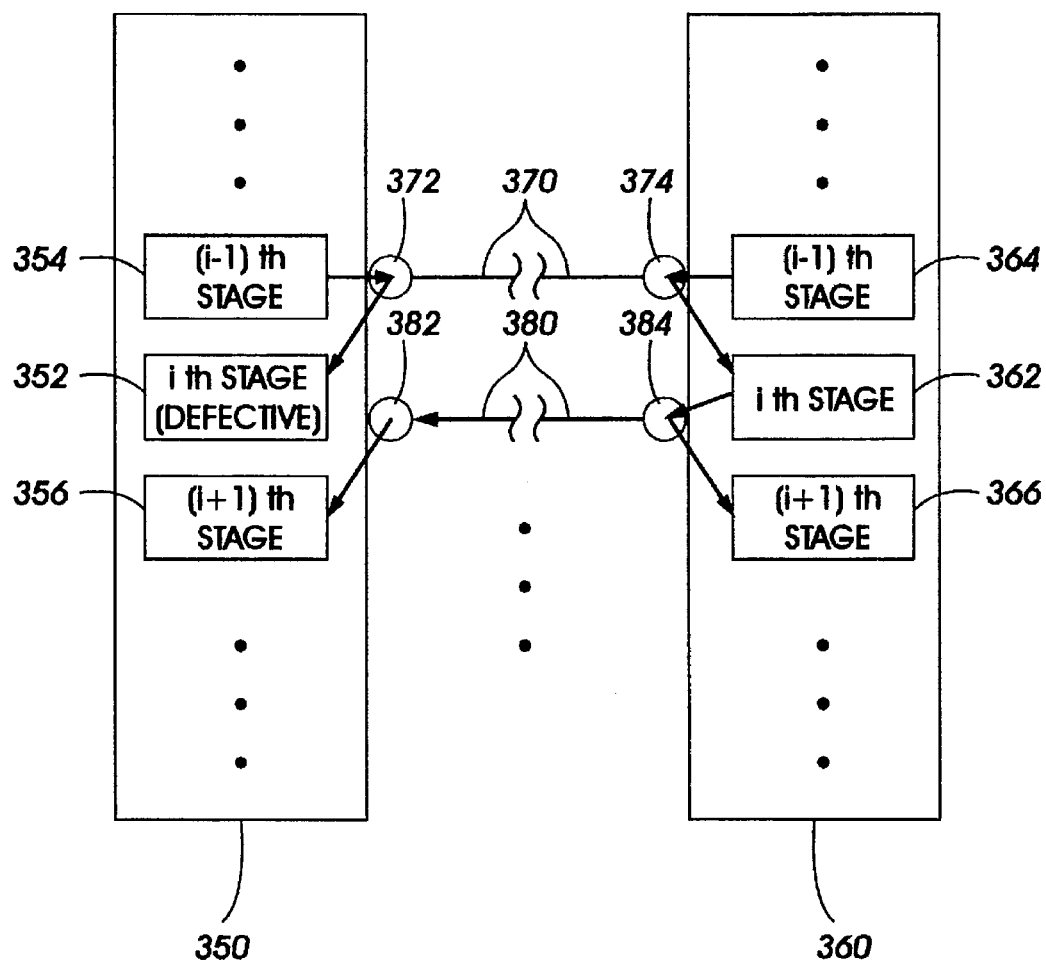
FIG. 7 is a schematic circuit diagram showing how signals can be provided and received across an array after a repair as in FIG. 6.
Figure 8:
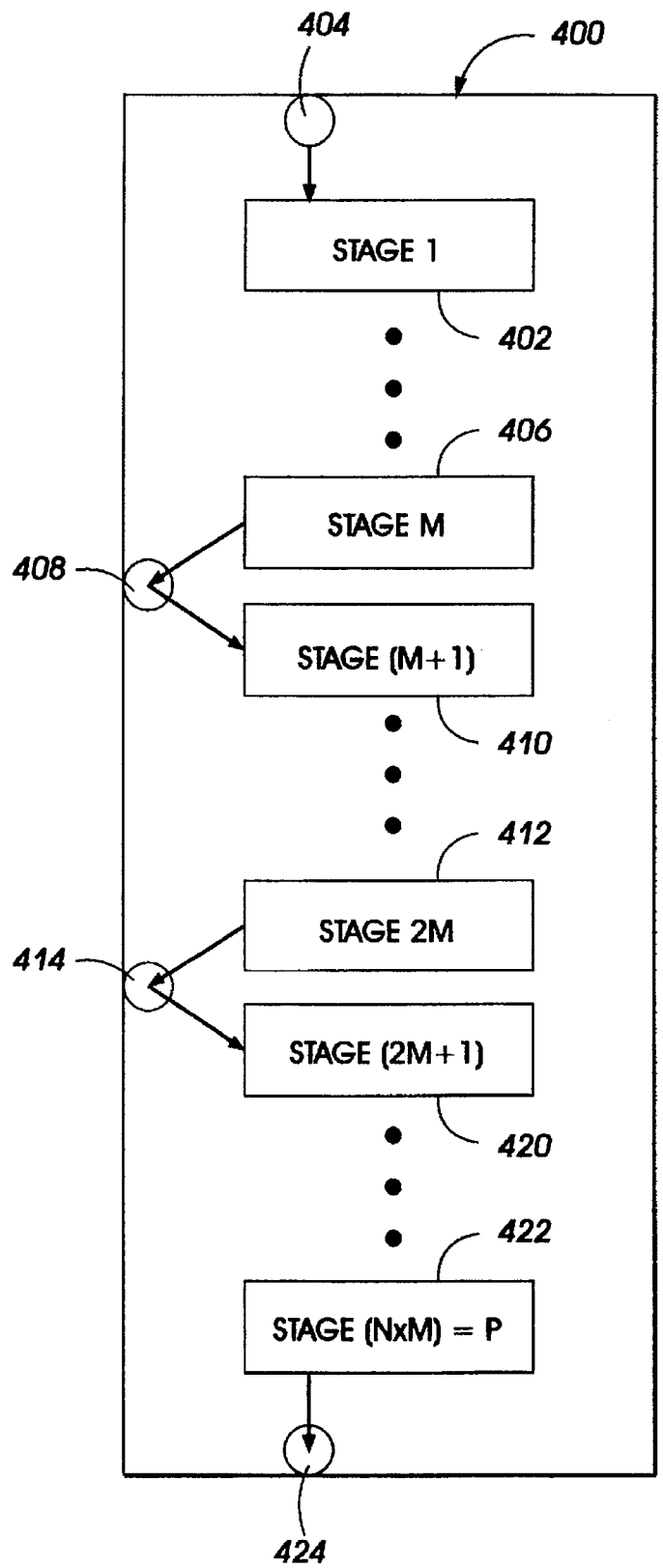
FIG. 8 is a schematic circuit diagram showing modified shift register circuitry with additional output/input leads for more efficient testing.

FIGS. 5–8 illustrate how testing and repair can be performed with the circuitry described above. FIG. 5 shows representative acts in testing. FIG. 6 shows how a repair can be performed to eliminate a defective shift register stage. FIG. 7 shows how signals can be provided and received across an array after a repair as in FIG. 6. FIG. 8 shows modified shift register circuitry with additional output/input leads for more efficient testing.

The act in box 280 in FIG. 5 begins by tri-stating one of the shift registers, referred to as the "receiving shift register" because it will receive the contents of the other shift register during the subsequent acts. The act in box 280 can be implemented by holding clock signal $\Phi_2$ at 0, and its complement at 1, for all the stages of the shift register.

The act in box 282 then provides signals from the other shift register, referred to as the "sending shift register." During this act, tri-state inverter 254 in each stage of the sending shift register provides an output value such that the array of values in the sending shift register can be used to perform a test. The act in box 282 can also include preliminary tests of the sending shift register to determine whether it can be successfully operated.

The act in box 282 can typically be implemented with a series of input signals to the sending shift register's input lead and a series of clock signals that shifts the input signals through the sending shift register, as discussed below for some exemplary tests. During the act in box 282, the receiving shift register continues to float at tri-state.

Therefore, the array of values from the sending shift register is provided on the scan lines. After each shifting operation, each stage of the sending shift register can be tri-stated as described above in relation to box 280.

The act in box 290 receives the array of values at the receiving shift register, meaning that the array of values is received by the stages of the receiving shift register, but shifted one stage from its position in the sending shift register. The act in box 290 can be implemented by raising clock signal $\Phi_1$ to 1 for each stage's tri-state inverter 252 in the receiving shift register.

The act in box 292 then unloads the receiving shift register by shifting the array of values serially to the output lead of the receiving shift register. The act in box 292 can be implemented with the same sequence of clock signals as a normal scanning operation, but the signals may be slowed to allow for analysis of the sequence of output signals. During the act in box 292, the sending shift register continues to float at tri-state.

Several examples of the act in box 282 are of particular interest. One example is to reset the sending shift register, which can be done by holding its input signal at 0 and holding both clock signals $\Phi_1$ and $\Phi_2$ at 1 for a sufficient interval for the input signal to propagate through all stages by cascading through the inverters. Similarly, the sending shift register can be set by holding its input signal at 1 and holding both clock signals at 1.

Another example is to test a shift register by resetting it as described above, and by then clocking a pattern through it and reading its output signal to determine whether the pattern was correctly transmitted. A typical test pattern would be a single 1 followed by all 0s. Both shift registers can first be tested in this manner—if neither is defective, further testing can be performed for opens and shorts in scan lines, for example. But if one or both of the shift registers is defective, further shift register testing and repair is necessary.

If only one shift register is defective, an implementation of FIG. 5 can be used to find its defective stage. The defective shift register may, for example, provide only 1s as output, indicating that one of its stages has its output stuck in the 1 state. Or it may provide only 0s as output, indicating a stage stuck in the 0 state.

If the defective stage is stuck in the 1 state, the act in box 282 can reset the defective shift register to 0s as described above, so that all its stages preceding the defective stage are providing 0s but the defective stage and all following stages are providing 1s. Then, the act in box 292 can count the 1s that are shifted out of the good shift register until the first 0: If the first 0 is after X cycles, the defective stage is the Xth stage from the end, or, if the shift registers each have P stages, the (P-X)th stage from the beginning of the defective shift register.

Conversely, if the defective stage is stuck in the 0 state, the act in box 282 can reset the defective shift register to 1s as described above, so that all its stages preceding the defective stage are providing 1s but the defective stage and all following stages are providing 0s. Then, the act in box 292 can count the 0s that are shifted out of the good shift register until the first 1: If the first 1 is after X cycles, the defective stage is the (P-X)th stage from the beginning of the defective shift register.

The above tests to find defective stages give ambiguous results if multiple defects interact such as defective shift register stages connected to defective scan lines. Therefore, other, more standard techniques may be necessary to detect and repair open and shorted scan lines, with test equipment such as the In-Process Tester (IPT) from Photon Dynamics, Inc., Milpitas, Calif., which can use noncontact methods to find defects in the array. If neither of the shift registers is defective, however, the shift registers may be used in a similar manner to find defective scan lines.

Data line to scan line shorts could, for example, be detected as follows: The act in box 280 could be omitted, and the act in box 282 could be implemented by resetting both shift registers and, at the same time driving the data lines with a data pattern. After an appropriate period of time, the act in box 290 could be performed, receiving signals from the scan lines in both shift registers. The location and number of data to scan line shorts for a given scan line can be determined by carefully selecting the input data patterns. The strength of a data to scan line short could be determined by varying the length of time between floating both shift registers and then receiving signals in both shift registers.

When a defective stage has been identified, it can be repaired by cutting its repair line. FIG. 6 illustrates how this can be done for a thin film implementation in which the repair line is formed in a bottom metal layer. Repair line 240, as illustrated in FIG. 3, is electrically connected between the output lead of tri-state inverter 254, on the one hand, and scan line 260 and next stage 262 on the other. Through an operation such as laser cutting, cut 310 has been formed, dividing repair line 240 into parts 312 and 314, between which there is an electrical open. Laser cutting could be performed with the Photon Dynamics LCD Panel Repair System using the integrated laser trim (ILT) capability described in Sheng, K. C., Qiu, H., Sondeno, J. R., Lain, J. K., and Addiego, G., "Laser repair processes for mass production of LCD panels," *Solid State Technology*, June 1993, pp. 91, 92, 94, and 95.

After cut 310 is formed, signals from the output of tri-state inverter 254 cannot reach scan line 260 or next stage 262. Instead, signals from scan line 260 will go to next stage 262 through line 320, lead 322, and line 324. As shown, lead 322 is a shared lead between line 320 and line 324.

FIG. 7 illustrates how the remaining stages of the shift registers can continue to operate normally after a defective stage has been removed as shown in FIG. 6. Shift register 350 includes defective ith stage 352, preceded by (i-1)th stage 354 and followed by (i+1)th stage 356. Similarly, shift register 360 includes ith stage 362, preceded by (i-1)th stage 364 and followed by (i+1)th stage 366.

After a repair that cuts the repair line of defective ith stage 352, (i-1)th stages 354 and 364 continue to provide output signals to scan line 370 through leads 372 and 374, respectively, and to ith stages 352 and 362, respectively. Since defective ith stage 352 no longer provides output signals to scan line 380 through lead 382, only ith stage 362 provides output signals to scan line 380 through lead 384, as well as providing output signals to (i+1)th stage 366. The signal on scan line 380, however, is provided to (i+1)th stage 356 through lead 382, so that (i+1)th stages 356 and 366 and following stages function normally despite the removal of defective ith stage 352.

In the implementation described above in relation to FIG. 2, each shift register has only one output lead. Therefore, if both shift registers were defective, testing and repair would be impossible. FIG. 8 illustrates a modification that would make it possible to test shift register stages in groups, making it possible to obtain a functioning array even if each shift register includes at least one defective stage.

Shift register 400 in FIG. 8 includes N groups of M stages, for a total of M×N=P stages. Between each pair of successive groups of M stages, shift register 400 includes an additional lead through which a preceding stage can provide an output signal or a following stage can receive an input signal.

The first group begins at first stage 402, connected to receive its input signal from lead 404, the input lead for the shift register. The first group ends at Mth stage 406, connected to provide its output signal to additional lead 408. The second group begins at (M+1)th stage 410, connected to receive an input signal from additional lead 408, and ends at 2Mth stage 412, connected to provide its output signal to additional lead 414. The third group begins at (2M+1)th stage 420, connected to receive an input signal from additional lead 414. The Nth group ends at Pth stage 422, connected to provide its output signal to lead 424, the output lead for the shift register.

If an array has redundant shift registers with N groups of M stages like shift register 400 in FIG. 8, testing can be performed group by group rather than over the shift registers as a whole. As long as one group from each pair of groups is not defective, all of the scan lines may be driven by making suitable repairs.

C.3. Results

The features in FIGS. 2–7 have been successfully implemented in an array produced using a high temperature poly-Si process. Working scan drivers have been produced by performing a series of tests to find a defective shift register and by then repairing the defect. Specifically, a short between a clock line and a scan line was identified and repaired by laser cutting.

The tests included testing each shift register to ensure that it could be reset to all 0s or all 1s by shifting it alone; running one bit through each shift register as described above; and testing each shift register by resetting it and sending signals to the other as described above.

C.4. Variations

The implementation described above uses shift registers in scan line drivers. The invention could be implemented with other types of scan line driver circuitry. For example, the invention could be implemented with scan line drivers that are decoders, by providing encoding circuitry for receiving signals from scan lines.

The implementation described above has two scan line drivers on opposite sides of an array. But the invention could be implemented to test scan line drivers on the same side of an array, such as a pair of redundant scan drive shift registers. And the invention could be implemented to test more than two scan line drivers, as in an array with two scan drive shift registers on the left and two on the right of the array.

The implementation described above employs poly-Si TFTs, but the invention could be implemented with other types of devices that can be integrated on the same substrate with an array. Connections between a shift register stage's output lead, the scan line it drives, and the input lead of the next shift register stage could be made with any appropriate combination of lines and leads, using any appropriate conductive layers.

The implementation described above employs higher level components, described in terms of tri-state inverters and back-to-back inverters. The invention could be implemented with other types of components that provide similar functionality. Specifically, the tri-state inverter at the output of each stage is especially useful in allowing the following stage to receive a signal from a scan line, but other components that have a floating output state could be used. Similarly, the back-to-back inverters functioning as a bus repeater could be replaced with other circuitry with similar functionality.

The implementation described above employs two-phase shift registers in which each stage includes relatively simple circuitry that is readily implemented with thin-film TFTs, and in which each stage receives specified input and clock signals. The invention could be implemented with many other types of shift registers, including shift registers in which each stage includes a 2-phase D flip flop or other storage device. The invention could be implemented with stages that receive various other combinations of signals or additional signals and that have more than two phases.

The implementation described above uses redundant shift registers to send and receive signals to test for shift register defects, but other tests could be performed, including tests for open and shorted scan lines, and the circuitry could allow for testing in other ways.

In the above implementation, a following stage receives a signal from a scan line that is driven by a preceding stage, but the invention could be implemented with circuitry allowing each stage to receive from the scan line that it drives.

The implementation described above performs tests with particular sequences of acts, but testing could be performed with sequences of other acts, or with the same acts performed in a different order.

The implementation described above allows for repair of a defective shift register by elimination of a defective stage, as described in more detail in copending, coassigned U.S. patent application Ser. No. 08/BBB,BBB (Attorney Docket No. D/95583Q), entitled "Array With Redundant Reparable Integrated Scan Drivers," incorporated herein by reference. The invention could be implemented without those repair techniques, although an implementation that allows repair in some way is advantageous.

The implementation described above provides thin film circuitry on an insulating substrate. The invention could be implemented with other types of circuitry on other types of substrates.

D. Application

The invention could be applied in many types of arrays, including display arrays, light valve arrays, sensor arrays, and other arrays that interact with images.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. In an array that includes:

a substrate with a surface at which circuitry is formed;

array circuitry at the surface of the substrate; the array circuitry including:

scan lines that extend across the surface of the substrate; and first and second scan drive circuitry electrically connected to the scan lines; for each of a set of the scan lines, the first and second scan drive circuitry including first and second signal providing circuitry, respectively; the first and second signal providing circuitry being electrically connected to the scan line for providing signals to the scan line;

an improvement comprising:

for at least one of the scan lines, the first scan drive circuitry further including first signal receiving circuitry electrically connected to the scan line for receiving signals from the scan line that are provided to the scan line by the second signal providing circuitry.

2. The improvement of claim 1 in which the surface of the substrate includes:

an array region having first and second opposite sides; and first and second scan drive regions adjacent the array region at the first and second sides of the array region, respectively;

the scan lines extending across the array region between the first and second sides, each scan line having first and second scan leads in the first and second scan drive regions, respectively; each scan line being electrically connected to its first and second scan leads; and the first and second scan drive circuitry being in the first and second scan drive regions, respectively; the first and second signal providing circuitry being electrically connected to the scan line's first and second scan leads, respectively;

the improvement further comprising:

for each of the scan lines for which the first scan drive circuitry includes first signal receiving circuitry, the scan line's first and second signal providing circuitry being electrically connected to the scan line's first and second scan leads, respectively; the first signal receiving circuitry being electrically connected to the scan line's first scan lead for receiving signals from the scan line that are provided to the scan line's second scan lead by the second signal providing circuitry.

3. The improvement of claim 2, further comprising:

for each of the scan lines for which the first scan drive circuitry includes first signal receiving circuitry, the second scan drive circuitry further including second signal receiving circuitry electrically connected to the scan line's second scan lead for receiving signals from the scan line that are provided to the scan line's first scan lead by the first signal providing circuitry.

4. The improvement of claim 1 in which the first scan drive circuitry includes first signal receiving circuitry for each of the scan lines in the set.

5. The improvement of claim 4 in which the set of the scan lines includes M scan lines; the first and second scan drive circuitry include first and second shift registers, respectively each of the first and second shift registers including M stages; for values of m from 1 to M, the mth stages of the first and second shift registers including the first and second signal providing circuitry, respectively;

for values of m from 2 to M, the mth stage of each of the first and second shift registers being electrically connected to receive signals from the (m−1)th stage of the shift register;

for values of m from 1 to (M−1), the mth stage of each of the first and second shift registers being electrically connected to provide signals to the (m+1)th stage of the shift register; the (m+1)th stage of the first shift register including the mth scan line's first signal receiving circuitry.

6. The improvement of claim 5 in which the array further includes external leads for receiving and providing signals to circuitry off of the substrate; the external leads including, for each of the first and second shift registers:

an input lead electrically connected to the 1st stage of the shift register;
the 1st stage receiving input signals through the input lead; and
an output lead electrically connected to the Pth stage of the shift register; the Pth stage providing output signals through the output lead;

the improvement further comprising:

for each of the first and second shift registers, at least one input/output lead, electrically connected to an mth stage and an (m+1)th stage; the mth stage providing output signals through the input/output lead and the (m+1)th stage receiving input signals through the input/output lead.

7. The improvement of claim 1 in which the first signal providing circuitry has a set of two or more signal providing states and at least one signal receiving state.

8. The improvement of claim 7 in which the first signal providing circuitry has two signal providing states and one signal receiving state.

9. The improvement of claim 8 in which the first signal providing circuitry includes a tri-state element electrically connected to the scan line; the tri-state element having an ON state, an OFF state, and a floating state; the tri-state element being in its floating state when the first signal providing circuitry is in its signal receiving state.

10. An array comprising:

a substrate with a surface at which circuitry is formed; the surface of the substrate including:

an array region having first and second opposite sides; and first and second scan drive regions adjacent the array region at the first and second sides of the array region, respectively;

array circuitry at the surface of the substrate; the array circuitry comprising:

M scan lines extending across the array region between the first and second sides; each scan line having first and second scan leads in the first and second scan drive regions, respectively; each scan line being electrically connected to its first and second scan leads; and first and second shift registers in the first and second scan drive regions, respectively, each including M stages, each stage including signal providing circuitry and signal receiving circuitry; each stage's signal providing circuitry having two signal providing states and one signal receiving state; for values of m from 1 to M, the mth scan line's signal lead being electrically connected to receive signals from the mth stage's signal providing circuitry of each of the first and second shift registers; for values of m from 1 to (M−1), the mth scan line's signal lead being electrically connected to provide signals to the (m+1)th stage's signal receiving circuitry of each of the first and second shift registers so that the mth stage's signal providing circuitry of one of the first and second shift registers can provide a signal to the mth scan line and the (m+1)th stage's signal receiving circuitry of the other of the first and second shift registers can receive the signal.

11. The array of claim 10 in which, for values of m from 1 to M, the mth stage's signal providing circuitry of each shift register comprises a tri-state element electrically connected to the mth scan line's scan lead; the tri-state element having an ON state, an OFF state, and a floating state; the tri-state element being in its floating state when the mth stage's signal providing circuitry of the other shift register is providing the signal.

12. The array of claim 10 in which the array is an active matrix display array.

13. An array comprising:

a substrate with a surface at which circuitry is formed; the surface of the substrate including:

an array region having first and second opposite sides; and first and second scan drive regions adjacent the array region at the first and second sides of the array region, respectively;

array circuitry at the surface of the substrate; the array circuitry comprising:

P scan lines extending across the array region between the first and second sides; each scan line having first and second scan leads in the first and second scan drive regions, respectively; each scan line being electrically connected to its first and second scan leads; and first and second shift registers in the first and second scan drive regions, respectively, each including N groups of M stages, where M and N are each greater than one and the product of M and N is P; each stage including signal providing circuitry and signal receiving circuitry; each stage's signal providing circuitry having two signal providing states and one signal receiving state;

for values of p from 1 to P, the pth scan line's signal lead being electrically connected to receive signals from the pth stage's signal providing circuitry of each of the first and second shift registers; for values of p from 1 to (P−1), the mth scan line's signal lead being electrically connected to provide signals to the (p+1)th stage's signal receiving circuitry of each of the first and second shift registers so that the pth stage's signal providing circuitry of one of the first and second shift registers can provide a signal to the pth scan line and the (p+1)th stage's signal receiving circuitry of the other of the first and second shift registers can receive the signal;

external leads for receiving and providing signals to circuitry off of the substrate; the external leads including, for each of the first and second shift registers:

- an input lead electrically connected to the 1st stage of the shift register;
- the 1st stage receiving input signals through the input lead;
- an output lead electrically connected to the Pth stage of the shift register; the Pth stage providing output signals through the output lead; and
- (N−1) input/output leads, each electrically connected to the Mth stage of one of the 1st through (N−1)th groups and to the 1st stage of the next group; the Mth stage of each of the 1st through (N−1)th groups providing output signals through the input/output lead and the 1st stage of the next group receiving input signals through the input/output lead.

* * * * *